US012598892B2

(12) United States Patent
Zhang et al.

(10) Patent No.: US 12,598,892 B2
(45) Date of Patent: Apr. 7, 2026

(54) LIGHT-EMITTING SUBSTRATE AND MANUFACTURING METHOD THEREOF, AND LIGHT-EMITTING APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yang Zhang, Beijing (CN); Bin Zhou, Beijing (CN); Ning Liu, Beijing (CN); Jun Liu, Beijing (CN); Peng Wang, Beijing (CN); Lei Zhou, Beijing (CN); Duoduo Wang, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 632 days.

(21) Appl. No.: 17/918,630

(22) PCT Filed: Nov. 23, 2021

(86) PCT No.: PCT/CN2021/132453
§ 371 (c)(1),
(2) Date: Oct. 13, 2022

(87) PCT Pub. No.: WO2022/227518
PCT Pub. Date: Nov. 3, 2022

(65) Prior Publication Data
US 2024/0164179 A1 May 16, 2024

(30) Foreign Application Priority Data

Apr. 28, 2021 (CN) .......................... 202110467821.6

(51) Int. Cl.
*H10K 59/80* (2023.01)
*H10K 59/12* (2023.01)

(52) U.S. Cl.
CPC ... *H10K 59/80522* (2023.02); *H10K 59/1201* (2023.02)

(58) Field of Classification Search
CPC ......... H10K 59/80522; H10K 59/1201; H10K 59/121; H10K 59/124; H10K 59/1315;
(Continued)

(56) References Cited

U.S. PATENT DOCUMENTS

2005/0077816 A1    4/2005    Yamada et al.
2012/0223342 A1*   9/2012    Tanada ................. H10K 50/814
                                                                257/40
(Continued)

FOREIGN PATENT DOCUMENTS

CN        1607876 A      4/2005
CN        102655220 A    9/2012
(Continued)

OTHER PUBLICATIONS

ScienceDirect ("1.7 The Orthogonal Projection", Chapter 'Elements of Descriptive Geometry'—https://www.sciencedirect.com/topics/engineering/orthogonal-projection (Year: 2022).*
(Continued)

*Primary Examiner* — Chad M Dicke
*Assistant Examiner* — Gary Abel
(74) *Attorney, Agent, or Firm* — XSENSUS LLP

(57) ABSTRACT

A light-emitting substrate includes: a substrate; and at least one coupling portion and at least one auxiliary cathode pattern disposed on the substrate. Each auxiliary cathode region is provided with a coupling portion and an auxiliary cathode pattern coupled to the coupling portion. The auxiliary cathode pattern includes at least one disconnection (Continued)

portion, and each disconnection portion includes first, second and third conductive pattern layers. An orthographic projection of an edge of the second conductive pattern layer on the substrate is located within orthographic projections of edges of the third and first conductive pattern layers on the substrate. A total perimeter of at least one orthographic projection, on the substrate, of at least one edge of at least one third conductive pattern layer in the at least one disconnection portion is greater than a perimeter of an orthographic projection of an edge of the auxiliary cathode region on the substrate.

19 Claims, 10 Drawing Sheets

(58) Field of Classification Search
CPC ...... H10K 59/00; H10K 50/824; H10K 71/00; H10K 59/80523; H10K 50/826
See application file for complete search history.

(56) References Cited

U.S. PATENT DOCUMENTS

| | | | | |
|---|---|---|---|---|
| 2016/0013438 | A1* | 1/2016 | Im | H10K 59/80522 |
| | | | | 257/762 |
| 2017/0133620 | A1 | 5/2017 | Lee et al. | |
| 2018/0261798 | A1* | 9/2018 | Choi | H10K 59/80522 |
| 2019/0006427 | A1 | 1/2019 | Lu et al. | |
| 2020/0075696 | A1* | 3/2020 | Gao | H10K 59/80524 |
| 2020/0287049 | A1* | 9/2020 | Jang | H10D 30/6729 |
| 2020/0403046 | A1 | 12/2020 | Su | |
| 2022/0093893 | A1 | 3/2022 | Zhang et al. | |
| 2022/0093894 | A1 | 3/2022 | Song et al. | |
| 2022/0199952 | A1* | 6/2022 | Jang | H10K 59/18 |

FOREIGN PATENT DOCUMENTS

| | | | | |
|---|---|---|---|---|
| CN | 206194793 | U | 5/2017 | |
| CN | 106992204 | A | 7/2017 | |
| CN | 112103326 | A | 12/2020 | |
| CN | 112103399 | A | 12/2020 | |
| CN | 112331801 | A | 2/2021 | |
| CN | 113241416 | A | 8/2021 | |
| EP | 4016635 | A1 * | 6/2022 | G09G 3/3225 |
| JP | 11-214161 | A | 8/1999 | |
| KR | 10-2016-0057197 | A | 5/2016 | |
| WO | 2019095297 | A1 | 5/2019 | |

OTHER PUBLICATIONS

Notification to Grant patent Right for Invention for Chinese Patent Application No. 202110467821.6 issued by the Chinese Patent Office on Aug. 4, 2022.

First Office Action for Chinese Patent Application No. 202110467821.6 issued by the Chinese Patent Office on Mar. 11, 2022.

* cited by examiner

LIGHT-EMITTING SUBSTRATE AND MANUFACTURING METHOD THEREOF, AND LIGHT-EMITTING APPARATUS

CROSS-REFERENCE TO RELATED APPLICATIONS

This application is a national phase entry under 35 USC 371 of International Patent Application No. PCT/CN 2021/132453 filed on Nov. 23, 2021, which claims priority to Chinese Patent Application No. 202110467821.6, filed on Apr. 28, 2021, which are incorporated herein by reference in their entirety.

TECHNICAL FIELD

The present disclosure relates to the field of lighting and display technologies, and in particular, to a light-emitting substrate and a manufacturing method thereof, and a light-emitting apparatus.

BACKGROUND

Organic light-emitting diodes (OLEDs) have characteristics of self-luminescence, wide viewing angle, short reaction time, high luminous efficiency, low working voltage, small substrate thickness, capability of being used for manufacturing large-size and bendable substrates, and simple manufacturing process, and are known as the next generation of "star" display technology.

SUMMARY

In an aspect, a light-emitting substrate is provided. The light-emitting substrate has a plurality of light-emitting regions and a non-light-emitting region except the plurality of light-emitting regions. The non-light-emitting region includes at least one auxiliary cathode region. The light-emitting substrate includes: a substrate; and at least one coupling portion and at least one auxiliary cathode pattern disposed on the substrate. Each auxiliary cathode region is provided with a coupling portion in the at least one coupling portion and an auxiliary cathode pattern in the at least one auxiliary cathode pattern therein. The coupling portion is located on a side of the auxiliary cathode pattern proximate to the substrate, and the auxiliary cathode pattern is coupled to the coupling portion. The auxiliary cathode pattern includes at least one disconnection portion, and each disconnection portion includes a first conductive pattern layer, a second conductive pattern layer and a third conductive pattern layer stacked in sequence in a direction away from the substrate. An orthographic projection of an edge of the second conductive pattern layer on the substrate is located within an orthographic projection of an edge of the third conductive pattern layer on the substrate, and is located within an orthographic projection of an edge of the first conductive pattern layer on the substrate. The orthographic projection of the edge of the second conductive pattern layer on the substrate and the orthographic projection of the edge of the third conductive pattern layer on the substrate have a first gap therebetween. The orthographic projection of the edge of the second conductive pattern layer on the substrate and the orthographic projection of the edge of the first conductive pattern layer on the substrate have a second gap therebetween. A total perimeter of at least one orthographic projection, on the substrate, of at least one edge of at least one third conductive pattern layer in the at least one disconnection portion is greater than a perimeter of an orthographic projection of an edge of the auxiliary cathode region on the substrate.

In some embodiments, the at least one disconnection portion includes a first disconnection portion and a second disconnection portion arranged in sequence in a first direction. An edge of a third conductive pattern layer in the first disconnection portion and an edge of a third conductive pattern layer in the second disconnection portion each include a first sub-edge and a second sub-edge arranged in sequence in the first direction, and a third sub-edge and a fourth sub-edge that are connected between the first sub-edge and the second sub-edge. The two first sub-edges are respectively overlapped with two sub-edges of the edge of the auxiliary cathode region arranged in the first direction. The two second sub-edges are located between the two first sub-edges. The first direction is an extending direction of a sub-edge of the edge of the auxiliary cathode region except the two sub-edges.

In some embodiments, in the two second sub-edges, at least one second sub-edge includes a plurality of first extending segments extending in a second direction and staggered in the first direction, and a second extending segment connected between every two adjacent first extending segments. The first direction is perpendicular to the second direction.

In some embodiments, the second extending segment extends in the first direction.

In some embodiments, the plurality of first extending segments include three first extending segments. In the three first extending segments, in the second direction, a first extending segment in a middle is closer to a corresponding first sub-edge than two first extending segments respectively located on two sides of the first extending segment in the middle. The two first extending segments respectively located on the two sides are located on a same straight line extending in the second direction.

In some embodiments, an insulating layer is disposed between the auxiliary cathode pattern and the coupling portion. A first via is disposed in the insulating layer, and the first disconnection portion is coupled to the coupling portion through the first via.

In some embodiments, an orthographic projection of an edge of the first via on the substrate is located within an orthographic projection of an edge of a second conductive pattern layer in the first disconnection portion on the substrate. The orthographic projection of the edge of the first via on the substrate and the orthographic projection of the edge of the second conductive pattern layer in the first disconnection portion on the substrate have a third gap therebetween. The third gap is less than or equal to 5 μm.

In some embodiments, an orthographic projection of an edge of the first via on the substrate is substantially parallel to an orthographic projection of the edge of the third conductive pattern layer in the first disconnection portion on the substrate.

In some embodiments, a second via is further disposed in the insulating layer, and the second disconnection portion is coupled to the coupling portion through the second via.

In some embodiments, an orthographic projection of an edge of the second via on the substrate is located within an orthographic projection of an edge of a second conductive pattern layer in the second disconnection portion on the substrate. The orthographic projection of the edge of the second via on the substrate and the orthographic projection of the edge of the second conductive pattern layer in the second disconnection portion on the substrate have a fourth gap therebetween. The fourth gap is less than or equal to 5 μm.

In some embodiments, the orthographic projection of the edge of the second via on the substrate is substantially parallel to an orthographic projection of the edge of the third conductive pattern layer in the second disconnection portion on the substrate.

In some embodiment, the light-emitting substrate further includes a first conductive thin film located in the plurality of light-emitting regions and the non-light-emitting region. The first conductive thin film includes a portion located in a region between the edge of the second conductive pattern layer and the edge of the third conductive pattern layer, and the portion of the first conductive thin film located in the region is in contact with the first conductive pattern layer.

In some embodiments, the light-emitting substrate further includes a thin film with a light-emitting function that is located in the plurality of light-emitting regions and the non-light-emitting region. The thin film with the light-emitting function is located on a side of the first conductive thin film proximate to the substrate. The thin film with the light-emitting function is non-overlapped with the region.

In some embodiments, the second gap is greater than or equal to the first gap, and the first gap is greater than or equal to 0.5 μm.

In some embodiments, a reference plane perpendicular to the first direction is made on the substrate and between the first disconnection portion and the second disconnection portion. The first disconnection portion and the second disconnection portion are mirror symmetrical with respect to the reference plane.

In some embodiments, the first conductive pattern layer and the third conductive pattern layer are each made of a transparent material, and the second conductive pattern layer is made of a metal material.

In another aspect, a light-emitting apparatus is provided. The light-emitting apparatus includes the above light-emitting substrate.

In yet another aspect, a manufacturing method of a light-emitting substrate is provided. The light-emitting substrate has a plurality of light-emitting regions and a non-light-emitting region except the plurality of light-emitting regions. The non-light-emitting region includes at least one auxiliary cathode region. The manufacturing method includes a following step.

At least one coupling portion and at least one auxiliary cathode pattern are formed on a substrate. Each auxiliary cathode region is provided with a coupling portion in the at least one coupling portion and an auxiliary cathode pattern in the at least one auxiliary cathode pattern therein. The coupling portion is located on a side of the auxiliary cathode pattern proximate to the substrate, and the auxiliary cathode pattern is coupled to the coupling portion. The auxiliary cathode pattern includes at least one disconnection portion, and each disconnection portion includes a first conductive pattern layer, a second conductive pattern layer and a third conductive pattern layer stacked in sequence in a direction away from the substrate. An orthographic projection of an edge of the second conductive pattern layer on the substrate is located within an orthographic projection of an edge of the third conductive pattern layer on the substrate, and is located within an orthographic projection of an edge of the first conductive pattern layer on the substrate. The orthographic projection of the edge of the second conductive pattern layer on the substrate and the orthographic projection of the edge of the third conductive pattern layer on the substrate have a first gap therebetween. The orthographic projection of the edge of the second conductive pattern layer on the substrate and the orthographic projection of the edge of the first conductive pattern layer on the substrate have a second gap therebetween. A total perimeter of at least one orthographic projection, on the substrate, of at least one edge of at least one third conductive pattern layer in the at least one disconnection portion is greater than a perimeter of an orthographic projection of an edge of the auxiliary cathode region.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figures 1, 2:
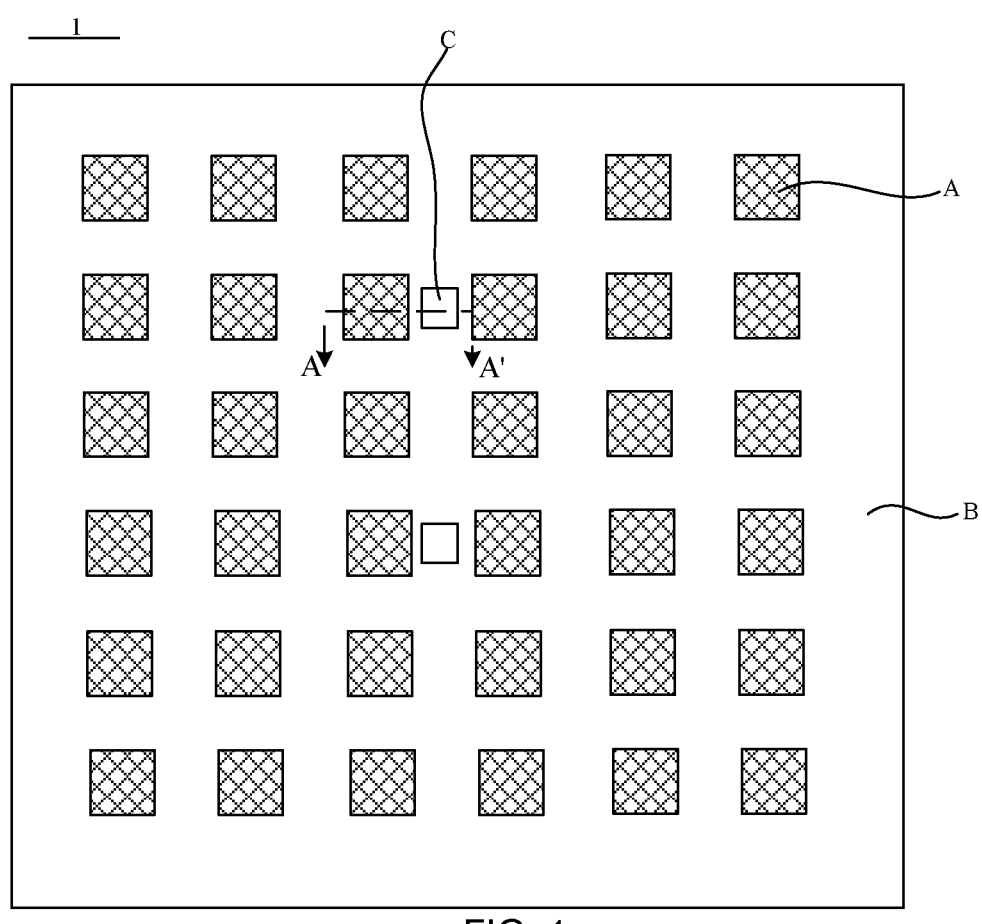
FIG. 1 is a top view of a light-emitting substrate, in accordance with some embodiments.
FIG. 2 is a sectional view taken along the A-A' direction in FIG. 1.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic designations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about" or "substantially" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Some embodiments of the present disclosure provide a light-emitting apparatus. The light-emitting apparatus includes a light-emitting substrate. Of course, the light-emitting apparatus may further include other components, such as a circuit for providing electrical signals to the light-emitting substrate to drive the light-emitting substrate to emit light. The circuit may be referred to as a control circuit, and may include a circuit board and/or an integrated circuit (IC) electrically connected to the light-emitting substrate.

In some embodiments, the light-emitting apparatus may be a lighting apparatus, and in this case, the light-emitting apparatus serves as a light source to realize a lighting function. For example, the light-emitting apparatus may be a backlight module in a liquid crystal display apparatus, a lamp for internal or external lighting, or a signal lamp.

In some other embodiments, the light-emitting apparatus may be a display apparatus, and in this case, the light-emitting substrate is a display substrate for realizing a function of displaying an image (i.e., screen). The light-emitting apparatus may include a display or a product including a display. The display may be a flat panel display (FPD), or a microdisplay. The display may be a transparent display or an opaque display, depending on whether a user can see a scene behind the display. The display may be a flexible display or a normal display (which may be referred to as a rigid display), depending on whether the display is bendable or rollable. For example, the product including the display may be a computer display, a television, a billboard, a laser printer with a display function, a telephone, a mobile phone, a personal digital assistant (PDA), a laptop computer, a digital camera, a camcorder, a viewfinder, a vehicle, a large area wall screen, a theater screen, or a stadium sign.

Some embodiments of the present disclosure provide the light-emitting substrate 1. As shown in FIGS. 1 and 2, the light-emitting substrate 1 has a plurality of light-emitting regions A and a non-light-emitting region B. The light-emitting region A, as the name implies, is a region that emits light. The non-light-emitting region B is a region except the light-emitting regions A.

In some embodiments, as shown in FIG. 2, the light-emitting substrate 1 includes a substrate 11, a pixel defining layer 12 and a plurality of light-emitting devices 13 that are all disposed on the substrate 11. The pixel defining layer 12 has a plurality of openings Q. Light-emitting devices 13 may be arranged in one-to-one correspondence with openings Q. Here, the light-emitting devices 13 may be all or part of the plurality of light-emitting devices 13 included in the light-emitting substrate 1, and the openings Q may be all or part of the plurality of openings Q in the pixel defining layer 12.

As shown in FIG. 2, each light-emitting device 13 may include a first electrode 131, a second electrode 132, and a light-emitting functional layer 133 disposed between the first electrode 131 and the second electrode 132. The first electrode 131 is closer to the substrate 11 than the second electrode 132, and the first electrode 131 is disposed on a side of the pixel defining layer 12 proximate to the substrate 11. A region corresponding to an opening Q constitutes a light-emitting region A. A region located outside the plurality of openings Q is the non-light-emitting region B.

As shown in FIG. 2, the first electrode 131 may be an anode, and the second electrode 132 may be a cathode. Alternatively, the first electrode 131 is a cathode, and the second electrode 132 is an anode.

Following embodiments of the present disclosure will described only in an example where the first electrode 131 is an anode, and the second electrode 132 is a cathode.

In the following embodiments, the light-emitting substrate 1 may be an OLED light-emitting substrate. In this case, the light-emitting functional layer 133 may include a light-emitting layer (i.e., emission layer, EML). The light-emitting layer EML may include a portion disposed in an opening Q. Of course, in order to improve the capability of injecting electrons and holes into the light-emitting layer EML, the light-emitting functional layer 133 may further include at least one of a hole transport layer, a hole injection layer, an electron transport layer and an electron injection layer. Hole transport layers included in light-emitting functional layers 133 in the plurality of light-emitting devices 13 may be arranged as a common layer of an integral structure, hole injection layers included in the light-emitting functional layers 133 may be arranged as a common layer of an integral structure, electron transport layers included in the light-emitting functional layers 133 may be arranged as a common layer of an integral structure, and electron injection layers included in the light-emitting functional layers 133 may be arranged as a common layer of an integral structure. Light-emitting layers EML included in the light-emitting functional layers 133, the hole transport layers, the hole injection layers, the electron transport layers and the electron injection layers may be formed by evaporation.

In some embodiments, in order to reduce the manufacturing difficulty and manufacturing cost of a metal mask used for evaporation, the light-emitting layers EML may be of an integral structure.

Following embodiments will be described in an example where the light-emitting layers EML in the light-emitting functional layers 133 are of an integral structure.

Figure 3:
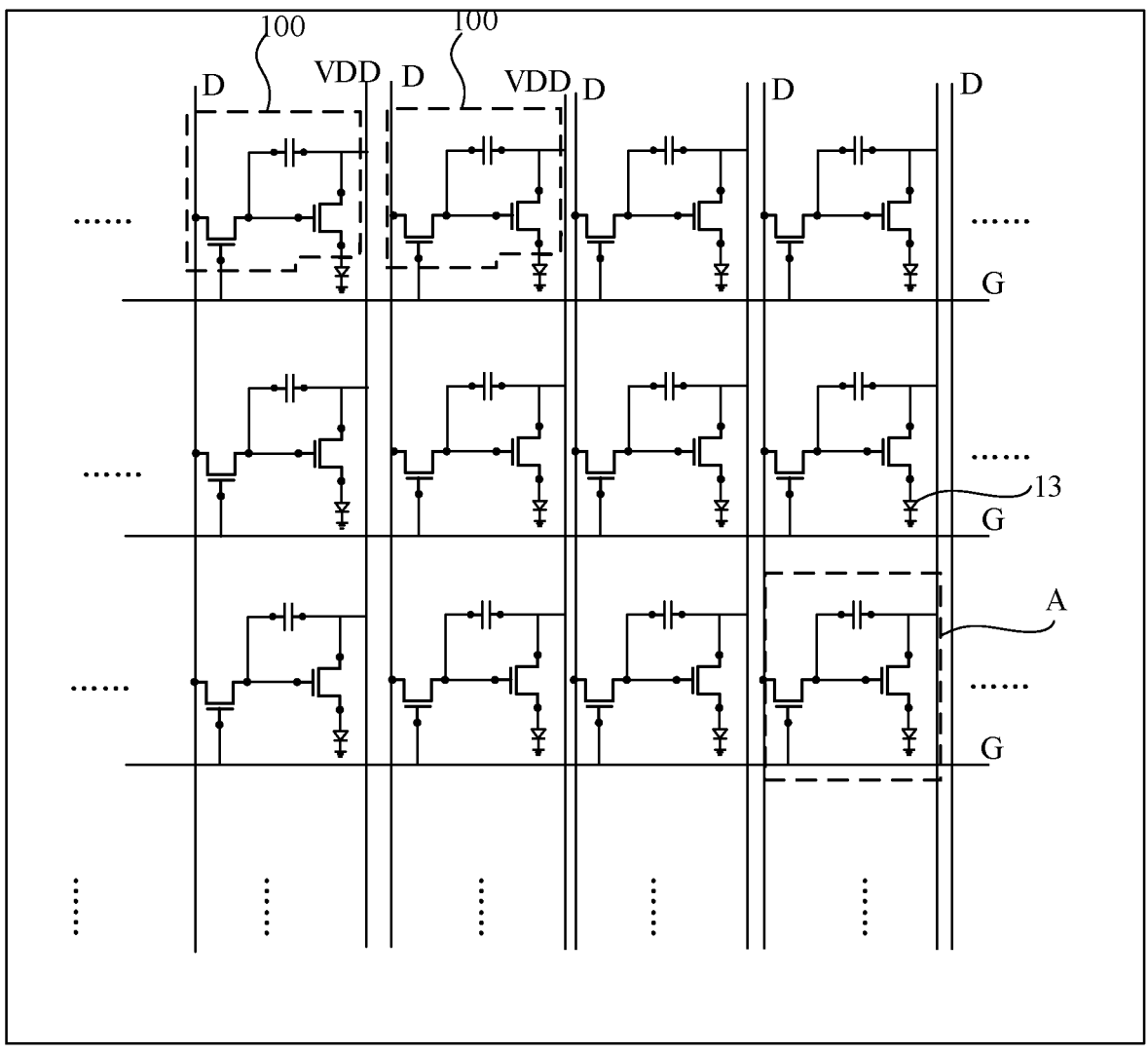
FIG. 3 is a top view of a light-emitting substrate, in accordance with some other embodiments.

In some embodiments, as shown in FIGS. 1 and 2, the non-light-emitting region B includes at least one auxiliary cathode region C. The auxiliary cathode region C, as the name implies, is a region for manufacturing an auxiliary cathode pattern. It can be understood by those skilled in the art that in order to emit light, for example, as shown in FIG. 3, the light-emitting substrate 1 may further include a plurality of pixel driving circuits 100. Referring to FIGS. 3 and 2, each pixel driving circuit 100 may include thin film transistors (TFT). The thin film transistor TFT may be, for example, a top-gate thin film transistor, and may include, from bottom to top, an active layer 101, a gate insulating layer 102, a gate 103, an interlayer insulating layer 104, and a source 105 and a drain 106. In an example where the thin film transistor TFT is a P-type thin film transistor, the drain 106 of the thin film transistor TFT is coupled to the anode of the light-emitting device 13, so as to transmit positive electricity (+) to the anode of the light-emitting device 13 and transmit negative electricity (−) to the cathode of the light-emitting device 13, so that an electric field is formed between the anode and the cathode to drive the light-emitting device 13 to emit light. In this process, in order to improve the luminous efficiency of the light-emitting device 13, as shown in FIG. 2, the light-emitting substrate 1 may further include coupling portion(s) 14 and auxiliary cathode pattern(s) 15 that are disposed on the substrate 11, and each auxiliary cathode region C is provided with a coupling portion 14 and an auxiliary cathode pattern 15 therein. The coupling portion 14 is located on a side of the auxiliary cathode pattern 15 proximate to the substrate 11. During the manufacturing of sources 105 and drains 106 of thin film transistors TFT in the plurality of pixel driving circuits 100, the coupling portion(s) 14 are respectively manufactured in the auxiliary cathode region(s) C. During the manufacturing of anodes in the plurality of light-emitting devices 13, the auxiliary cathode pattern(s) 15 are respectively manufactured in the auxiliary cathode region(s) C. The cathode and the coupling portion 14 are lapped through the auxiliary cathode pattern 15, so that a resistance of the cathode is reduced, and thus the thickness of the cathode may be reduced to increase a transmittance of the cathode, thereby improving the luminous efficiency and reducing the power consumption.

In order to form the auxiliary cathode pattern 15, it is necessary to disconnect the light-emitting layers EML of the integral structure by using structure(s) with a shape of " ⊥ ", so that the cathode is lapped on the auxiliary cathode pattern 15. The auxiliary cathode pattern 15 is lapped on the coupling portion 14 through a via O in insulating layers (e.g., a passivation layer 107 and a planarization layer 108) disposed between the auxiliary cathode pattern 15 and the coupling portion 14, thereby completing the lapping of the cathode and the coupling portion 14.

In some embodiments, in the pixel driving circuit 100, the active layer 101 of the thin film transistor TFT may be made of indium gallium zinc oxide (IGZO), and may have a thickness in a range of 300 nm to 500 nm. The gate 103, the source 105, the drain 106 and the coupling portion 14 each may be made of copper, molybdenum, or a copper-molybdenum alloy, and each may have a thickness in a range of 3000 nm to 6000 nm. The gate insulating layer 102, the interlayer insulating layer 104 and the passivation layer 107 each may be made of an insulating material, such as silicon oxide, silicon nitride or silicon oxynitride. The gate insulating layer 102 may have a thickness in a range of 1000 nm to 2000 nm. The interlayer insulating layer 104 may have a thickness in a range of 5000 nm to 8000 nm. The passivation layer 107 may have a thickness in a range of 3000 nm to 6000 nm. The planarization layer 108 may be made of an acrylic material.

Of course, in order to shield the thin film transistors TFT in the plurality of pixel driving circuits 100, as shown in FIG. 2, the light-emitting substrate 1 may further include light-shielding layers 16. The light-shielding layer 16 may be made of molybdenum (Mo) or a molybdenum-aluminum alloy, or has a stacked structure of Mo/Al/Mo. The light-shielding layer 16 may have a thickness in a range of 1000 nm to 2000 nm.

In some other embodiments, as shown in FIG. 2, the light-emitting substrate 1 further includes buffer layers 17. The buffer layer 17 is disposed on a side of the light-shielding layer 16 away from the substrate 11. The buffer layer 17 may be made of SiO, and may have a thickness in a range of 2000 nm to 5000 nm.

Figure 4:
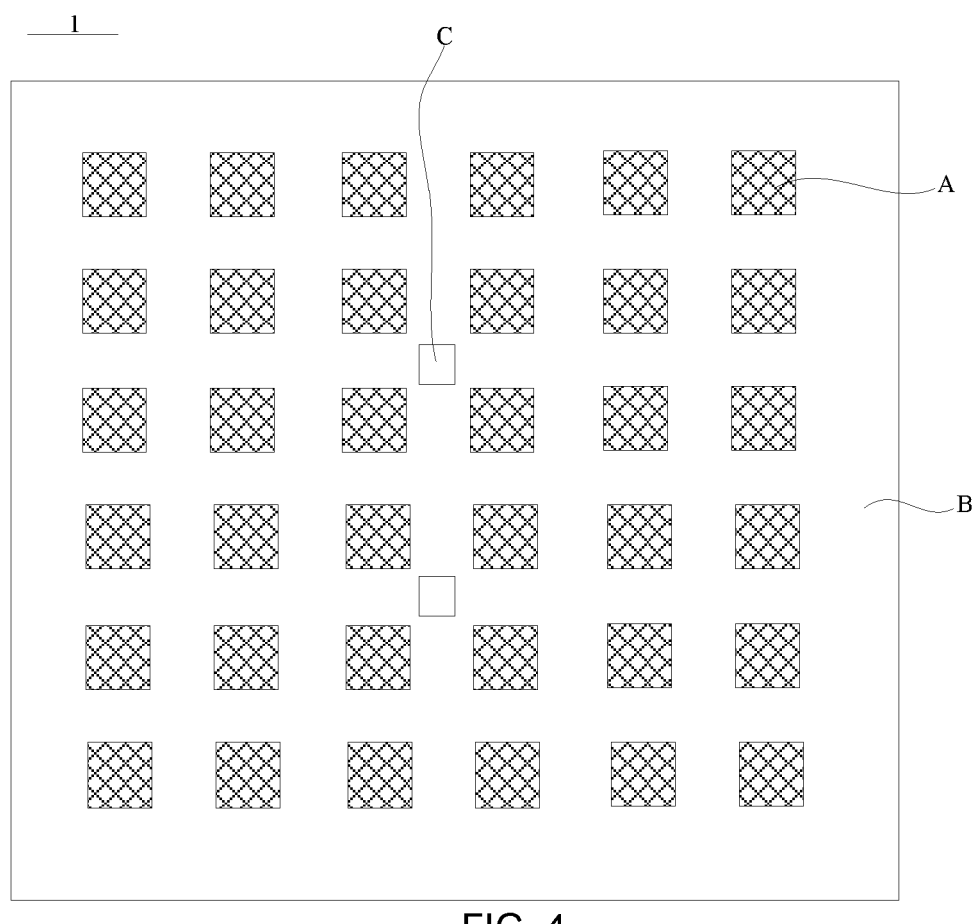
FIG. 4 is a top view of a light-emitting substrate, in accordance with yet other embodiments.

In some embodiments, FIGS. 1 and 4 are top views of the light-emitting substrate 1 with the plurality of light-emitting regions A arranged in an array. In FIGS. 1 and 4, the light-emitting regions A are respectively represented by rectangular blocks, and the region except the light-emitting regions A is the non-light-emitting region B. In this case, as shown in FIG. 1, the auxiliary cathode region C may be located between two rectangular blocks. Alternatively, as shown in FIG. 4, the auxiliary cathode region C may be located at a center of a region enclosed by four rectangular blocks.

In some embodiments, as shown in FIG. 2, each auxiliary cathode pattern 15 includes at least one disconnection portion 151. Each disconnection portion 151 includes a first conductive pattern layer 151a, a second conductive pattern layer 151b and a third conductive pattern layer 151c stacked in sequence in a direction Y away from the substrate 11. An orthographic projection of an edge of the second conductive pattern layer 151b on the substrate 11 is located within an orthographic projection of an edge of the third conductive pattern layer 151c on the substrate 11, and is located within an orthographic projection of an edge of the first conductive pattern layer 151a on the substrate 11. Moreover, the orthographic projection of the edge of the second conductive pattern layer 151b on the substrate 11 and the orthographic projection of the edge of the third conductive pattern layer 151c on the substrate 11 have a first gap g1 therebetween. The orthographic projection of the edge of the second conductive pattern layer 151b on the substrate 11 and the orthographic projection of the edge of the first conductive pattern layer 151a on the substrate 11 have a second gap g2 therebetween.

In these embodiments, the orthographic projection of the edge of the second conductive pattern layer 151b on the substrate is located within the orthographic projection of the edge of the third conductive pattern layer 151c on the substrate 11, and is located within the orthographic projection of the edge of the first conductive pattern layer 151a on the substrate 11. This means that both the orthographic projection of the edge of the third conductive pattern layer 151c on the substrate 11 and the orthographic projection of the edge of the first conductive pattern layer 151a on the substrate 11 exceed the orthographic projection of the edge of the second conductive pattern layer 151b on the substrate 11. That is, a longitudinal section of each disconnection portion 151 is in the shape of " $\mathrm{\underline{T}}$ ".

Figure 5:
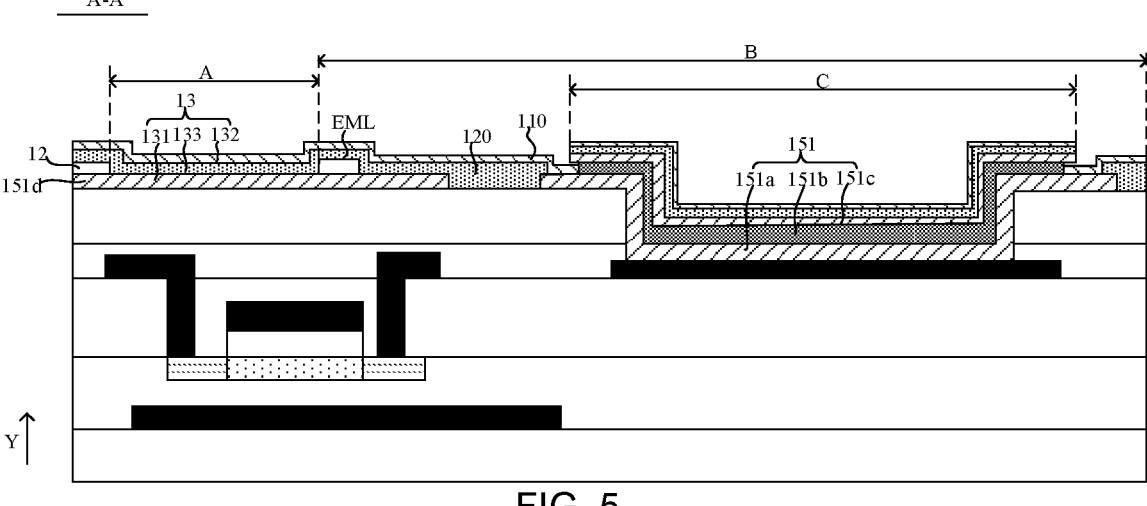
FIG. 5 is another sectional view taken along the A-A' direction in FIG. 1.

In some embodiments, as shown in FIGS. 2 and 5, the light-emitting substrate 1 includes the first electrodes 131 each located in a light-emitting region A. As shown in FIG. 5, each first electrode 131 includes a fourth conductive pattern layer 151d arranged in a same layer as the first conductive pattern layer 151a. Alternatively, as shown in FIG. 2, each first electrode 131 includes a fifth conductive pattern layer 151e, a sixth conductive pattern layer 151f and a seventh conductive pattern layer 151g that are stacked in sequence in the direction Y away from the substrate 11. The fifth conductive pattern layer 151e and the first conductive pattern layer 151a are arranged in a same layer. The sixth conductive pattern layer 151f and the second conductive pattern layer 151b are arranged in a same layer. The seventh conductive pattern layer 151g and the third conductive pattern layer 151c are arranged in a same layer.

In these embodiments, the first electrode 131 is the anode. In a case where the first electrode 131 includes the fourth conductive pattern layer 151d, the fourth conductive pattern layer 151d and the first conductive pattern layer 151a may be formed by one patterning process. In a case where the first electrode 131 includes the fifth conductive pattern layer 151e, the sixth conductive pattern layer 151f and the seventh conductive pattern layer 151g, the fifth conductive pattern layer 151e and the first conductive pattern layer 151a are formed by one patterning process, the sixth conductive pattern layer 151f and the second conductive pattern layer

151b are formed by one patterning process, and the seventh conductive pattern layer 151g and the third conductive pattern layer 151c are formed by one patterning process.

In some embodiments, as shown in FIGS. 2 and 5, the first conductive pattern layer 151a and the third conductive pattern layer 151c are each made of a transparent material, and the second conductive pattern layer 151b is made of a metal material.

In these embodiments, the first conductive pattern layer 151a and the third conductive pattern layer 151c may be made of a same material. The material of the second conductive pattern layer 151b may be etched by using an etching solution with a high selectivity, so as to form the structure with the shape of " $\mathrm{\underline{T}}$ ". In the etching process, a rate at which the material of the second conductive pattern layer 151b is etched is greater than a rate at which the material of the first conductive pattern layer 151a is etched, and is greater than a rate at which the material of the third conductive pattern layer 151c is etched, thereby forming the structure with the shape of " $\mathrm{\underline{T}}$ ".

The material of the first conductive pattern layer 151a and the material of the third conductive pattern layer 151c each may be selected from transparent conductive materials such as indium tin oxide (ITO), indium zinc oxide (IZO), tin dioxide ($SnO_2$) and zinc oxide (ZnO). The material of the second conductive pattern layer 151b may be selected from metal materials such as silver and alloys thereof, and aluminum and alloys thereof.

In the case where the first electrode 131 includes the fourth conductive pattern layer 151d, the fourth conductive pattern layer 151d and the first conductive pattern layer 151a may be made of the same material, which is a transparent conductive material. In this case, the light-emitting substrate 1 may be a bottom-emitting light-emitting substrate. In this case, a material of the second electrode 132 may be selected from low work function materials, such as metals aluminum (Al), silver (Ag) and magnesium (Mg), or selected from low work function metal alloy materials (e.g., magnesium-aluminum alloys and magnesium-silver alloys).

In the case where the first electrode 131 includes the fifth conductive pattern layer 151e, the sixth conductive pattern layer 151f and the seventh conductive pattern layer 151g, the fifth conductive pattern layer 151e and the first conductive pattern layer 151a are made of the same material, the sixth conductive pattern layer 151f and the second conductive pattern layer 151b are made of the same material, and the seventh conductive pattern layer 151g and the third conductive pattern layer 151c are made of the same material. The light-emitting substrate 1 may be a top-emitting light-emitting substrate. In this case, the material of the second electrode 132 may be selected from low work function materials, such as metals Al, Ag and Mg, or selected from low work function metal alloy materials (e.g., magnesium-aluminum alloys and magnesium-silver alloys). Moreover, the first electrode 132 has a small thickness to transmit light.

In some embodiments, as shown in FIGS. 2 and 5, the light-emitting substrate 1 further includes a first conductive thin film 110 that is disposed on the substrate 11 and located in the plurality of light-emitting regions A and the non-light-emitting region B. The first conductive thin film 110 includes portion(s) each located in a region R between the edge of the second conductive pattern layer 151b and the edge of the third conductive pattern layer 151c, and the portion of the first conductive thin film 110 located in the region R is in contact with the first conductive pattern layer 151a.

That is, the first conductive thin film 110 may be cathodes in the plurality of light-emitting devices 13. The cathodes are arranged as a whole layer to cover the substrate 11, and the cathodes are in contact with the first conductive pattern layer 151a, so that the cathodes are lapped on the auxiliary cathode pattern 15.

In some embodiments, as shown in FIGS. 2 and 5, the light-emitting substrate 1 further includes a thin film 120 with a light-emitting function that is disposed on the substrate 11 and located in the plurality of light-emitting regions A and the non-light-emitting region B. The thin film 120 with the light-emitting function is non-overlapped with the first region R.

That is, the thin film 120 with the light-emitting function may be formed by evaporation. Since in the non-light-emitting region B, the orthographic projection of the edge of the second conductive pattern layer 151b on the substrate 11 is located within the orthographic projection of the edge of the third conductive pattern layer 151c on the substrate 11, and the orthographic projection of the edge of the second conductive pattern layer 151b on the substrate 11 and the orthographic projection of the edge of the third conductive pattern layer 151c on the substrate 11 have the first gap g1 therebetween, during the evaporation of the thin film 120 with the light-emitting function, due to the shielding of the region R by the third conductive pattern layer 151c, the thin film 120 with the light-emitting function includes portions each formed in a light-emitting region A and portion(s) each formed on a surface of the third conductive pattern layer 151c away from the substrate 11, and the thin film 120 with the light-emitting function is non-overlapped with the region R. In this way, the region R may be reserved for the lapping of the first conductive thin film 110 and the auxiliary cathode pattern 15 when the first conductive thin film 110 is subsequently formed.

Whether the portion of first conductive thin film 110 located in the region R is all in contact with the first conductive pattern layer 151a depends on a magnitude of the second gap g2 relative to the first gap g1. As shown in FIGS. 2 and 5, in a case where the magnitude of the second gap g2 is greater than or equal to the magnitude of the first gap g1, the portion of the first conductive thin film 110 located in the region R is all in contact with the first conductive pattern layer 151a. However, in a case where the magnitude of the second gap g2 is less than the magnitude of the first gap g1, the portion of the first conductive film 110 located in the region R is partially in contact with the first conductive pattern layer 151a. It can be known that in order to increase a lapping area of the first conductive thin film 110 and the auxiliary cathode pattern 15, the magnitude of the second gap g2 is greater than or equal to the magnitude of the first gap g1.

Referring to FIGS. 2 and 5, in the case where the magnitude of the second gap g2 is greater than or equal to the magnitude of the first gap g1, the lapping area of the first conductive thin film 110 and the auxiliary cathode pattern 15 depends on the magnitude of the first gap g1 and a perimeter of the orthographic projection of the edge of the third conductive pattern layer 151c.

Figures 6, 7:
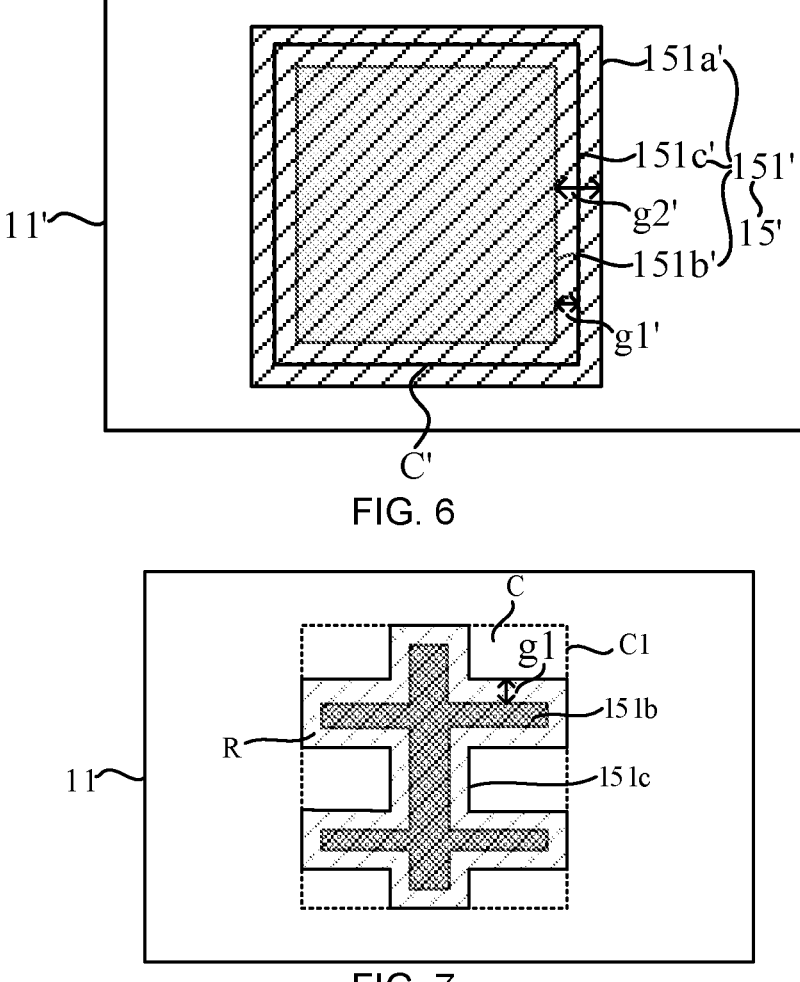
FIG. 6 is top view of an auxiliary cathode pattern in the related art.
FIG. 7 is a top view of an auxiliary cathode pattern, in accordance with some embodiments.

FIG. 6 is a top view of an auxiliary cathode pattern 15' in the related art. It can be seen from FIG. 6 that the auxiliary cathode pattern' 15 includes a disconnection portion 151', and orthographic projections, on the substrate 11, of edges of conductive pattern layers in the disconnection portion 151' are each in a shape of rectangle. A shape of a lapping region of the auxiliary cathode pattern 15' and a first conductive thin film is a square loop. The square loop is enclosed by an orthographic projection of an edge of a third conductive pattern layer 151c' on a substrate 11' and an orthographic projection of an edge of a second conductive pattern layer 151b' on the substrate 11'. A lapping area of the auxiliary cathode pattern 15' and the first conductive thin film is equal to an area of the square loop, and the area of the square loop is related to a perimeter of the orthographic projection of the edge of the third conductive pattern layer 151c' and a magnitude of a first gap g1'.

Here, in an example where a region enclosed by the edge of the third conductive pattern layer 151c' in the auxiliary cathode pattern 15' is an auxiliary cathode region C', in a case where an area of the auxiliary cathode region C is determined, and a magnitude of a second gap g2' is greater than or equal to a magnitude of the first gap g1', the lapping area of the auxiliary cathode pattern 15' and the first conductive thin film may be increased by increasing the magnitude of the first gap g1' and/or the perimeter of the orthographic projection of the edge of the third conductive pattern layer 151c'.

Figure 8:
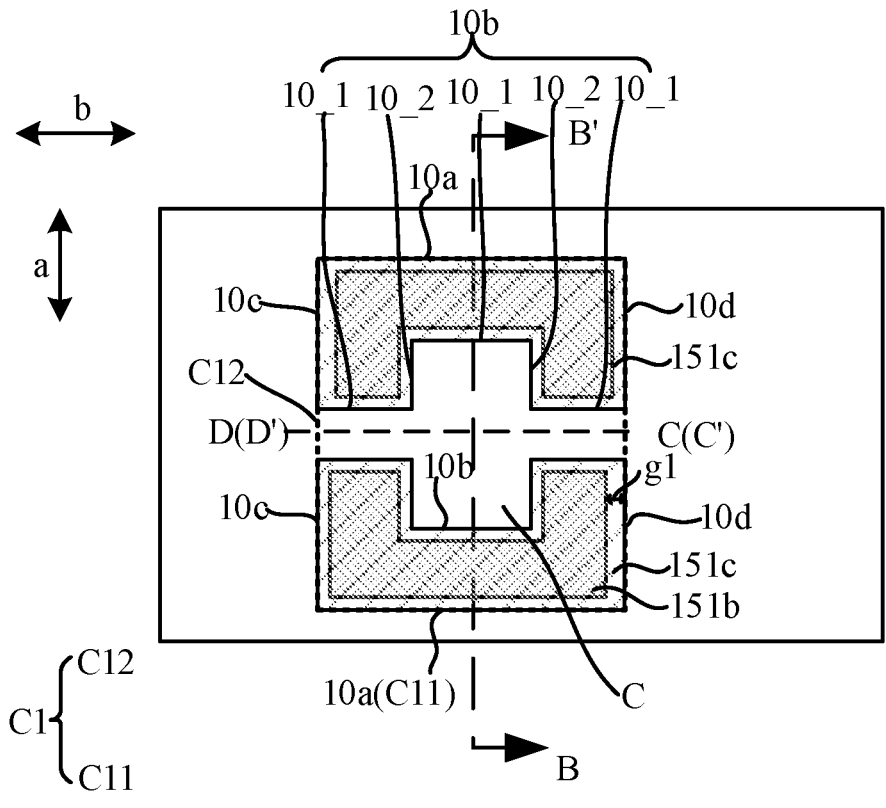
FIG. 8 is a top view of an auxiliary cathode pattern, in accordance with some other embodiments.

Based on this, in some embodiments, as shown in FIGS. 7 and 8, a total perimeter of the orthographic projection(s) of the edge(s) of the third conductive pattern layer(s) 151c in the at least one disconnection portion 151 is greater than a perimeter of an orthographic projection of an edge C1 of the auxiliary cathode region C on the substrate 11.

In these embodiments, compared with the related art in which there is a single disconnection portion 151', on one hand, there may be a single disconnection portion 151, or the number of disconnection portions 151 may be two or more. On another hand, the total perimeter of the orthographic projection(s) of the edge(s) of the third conductive pattern layer(s) 151c in the at least one disconnection portion 151 is greater than the perimeter of the orthographic projection of the edge C1 of the auxiliary cathode region C, so that in a case where the magnitude of the first gap g1 is unchanged, the lapping area of the auxiliary cathode pattern 15 and the first conductive thin film 110 may be increased when an area of the auxiliary cathode region C is determined. Thus, a large lapping area of the auxiliary cathode pattern 15 and the first conductive thin film 110 may be realized in a limited auxiliary cathode region C, which is conducive to reducing the resistance of the cathode and the power consumption, thereby reducing the thickness of the cathode. Moreover, in a case where the light-emitting substrate 1 is a top-emitting light-emitting substrate, the transmittance of the cathode may be increased to improve the luminous efficiency by reducing the thickness of the cathode.

Here, it will be noted that in the embodiments of the present disclosure, the description is made in an example where the shape of the orthographic projection of the edge of the third conductive pattern layer 151c in the auxiliary cathode pattern 15 is a rectangle. It can be understood by those skilled in the art that the orthographic projection of the edge C1 of the auxiliary cathode region C may have any other shape as the orthographic projection of the edge of the third conductive pattern layer 151c in the auxiliary cathode pattern 15 may have any other shape, which is not specifically limited here. For example, the shape of the orthographic projection of the edge of the third conductive pattern layer 151c in the auxiliary cathode pattern 15 may be a circle, and in this case, the shape of the orthographic projection of the edge of the auxiliary cathode region C is also a circle. In following embodiments, a description will be made in an example where the shape of the orthographic projection of the edge of the auxiliary cathode region C is a rectangle.

In addition, it will be noted that in a case where the shape of the orthographic projection of the edge of the auxiliary cathode region C is determined, the shape of the orthographic projection of the edge of the third conductive pattern layer 151c in each disconnection portion 151 provided in the embodiments of the present disclosure is not specifically limited, as long as the total perimeter of the orthographic projection(s) of the edge(s) of the third conductive pattern layer(s) 151c in the at least one disconnection portion 151 is greater than the perimeter of the orthographic projection of the edge of the auxiliary cathode region C. For example, in a case where the shape of the orthographic projection of the edge of the auxiliary cathode region C is a rectangle, the at least one disconnection portion 151 may include a single disconnection portion 151, and the shape of the orthographic projection of the edge of the third conductive pattern layer 151c in the disconnection portion 151 may be as shown by the edge of the third conductive pattern layer 151c in FIG. 7.

In some embodiments, as shown in FIGS. 7 and 8, the first gap g1 is greater than or equal to 0.5 μm.

In these embodiments, by limiting the magnitude of the first gap g1 to be greater than or equal to 0.5 μm, a large first gap g1 may be ensured, so that the lapping area of the first conductive thin film 110 and the auxiliary cathode pattern 15 may be further increased in a case where the total perimeter of the orthographic projection(s) of the edge(s) of the third conductive pattern layer(s) 151c in the disconnection portion(s) 151 is unchanged.

Figure 9:
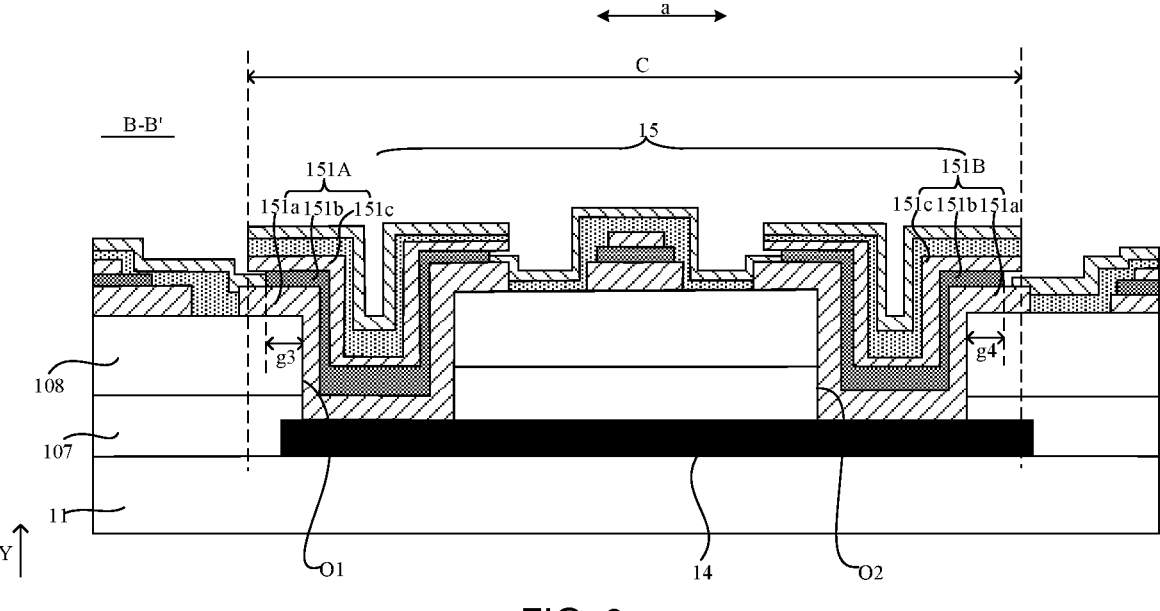
FIG. 9 is a sectional view taken along the B-B' direction in FIG. 8.

In some embodiments, as shown in FIGS. 8 and 9, the at least one disconnection portion 151 includes a first disconnection portion 151A and a second disconnection portion 151B arranged in sequence in a first direction (i.e., the direction indicated by the arrow a in FIG. 8 or 9). A third conductive pattern layer 151c in the first disconnection portion 151A and a third conductive pattern layer 151c in the second disconnection portion 151B each include a first sub-edge 10a and a second sub-edge 10b arranged in sequence in the first direction, and a third sub-edge 10c and a fourth sub-edge 10d that are connected between the first sub-edge 10a and the second sub-edge 10b. The two first sub-edges 10a are respectively overlapped with two sub-edges C11 of the auxiliary cathode region C arranged in the first direction. The two second sub-edges 10b are located between the two first sub-edges 10a. The first direction is an extending direction of a sub-edge C12 of the auxiliary cathode region C.

In these embodiments, by providing the first disconnection portion 151A and the second disconnection portion 151B, two third conductive pattern layers 151c may be formed. Compared with the related art in which the shape of the orthographic projection of the edge of the third conductive pattern layer 151c' is a rectangle, the orthographic projections of the edges of the third conductive pattern layers 151c in the auxiliary cathode pattern 15 constitute substantially a shape of "▯", and a shape of a lapping region of the first conductive thin film 110 and the auxiliary cathode pattern 15 has two square loops arranged side by side, so that the lapping area of the first conductive thin film 110 and the auxiliary cathode pattern 15 may be increased.

For each disconnection portion 151, the third sub-edge 10c and the fourth sub-edge 10d may be respectively overlapped with two sub-edges C12 of the auxiliary cathode region C arranged in a second direction (i.e., the direction indicated by the arrow b in FIG. 8). The second direction is perpendicular to the first direction. Of course, it will be noted that in order to further increase the total perimeter of the orthographic projections of the edges of the third conductive pattern layers 151c in the auxiliary cathode pattern 15, in at least one of the third sub-edge 10c and the fourth sub-edge 10d, a partial extending segment is overlapped with the edge C1 of the auxiliary cathode region C, and another partial extending segment may be recessed toward the interior of the auxiliary cathode region C.

In some embodiments, as shown in FIG. 8, in the two second sub-edges 10b, at least one second sub-edge 10b includes a plurality of first extending segments 10_1 extending in the second direction (i.e., the direction indicated by the arrow b in FIG. 8) and staggered in the first direction, and a second extending segment 10_2 connected between every two adjacent first extending segments 10_1. The first direction is perpendicular to the second direction.

In these embodiments, compared with a case that the second sub-edge 10b is a straight line extending in the second direction, since the at least one second sub-edge 10b is formed by connecting the first extending segments 10_1 and the second extending segments 10_2, the total perimeter of the orthographic projections of the edges of the third conductive pattern layers 151c in the auxiliary cathode pattern 15 may be further increased, so that the lapping area of the first conductive thin film 110 and the auxiliary cathode pattern 15 may be further increased.

In some embodiments, as shown in FIG. 8, the second extending segment 10_2 extends in the first direction, which may reduce the manufacturing difficulty of each disconnection portion 151, and is able to reduce the manufacturing difficulty of the mask for manufacturing the auxiliary cathode pattern 15.

In some embodiments, as shown in FIG. 8, the number of the first extending segments 10_1 is three. In the second direction, the first extending segment 10_1 in the middle is closer to the first sub-edge 10a than the first extending segments 10_1 respectively located on two sides of the first extending segment 10_1 in the middle, and the first extending segments 10_1 respectively located on the two sides are located on a same straight line extending in the second direction. That is, the middle of the second sub-edge 10b is recessed toward the first sub-edge 10a. Thus, in a case where the orthographic projections of the first sub-edge 10a, the third sub-edge 10c and the fourth sub-edge 10d on the substrate 11 are each overlapped with the orthographic projection of the edge C1 of the auxiliary cathode region C on the substrate 11, a length of the second sub-edge 10b in the second direction may be increased as much as possible, so that the lapping area of the first conductive thin film 110 and the auxiliary cathode pattern is able to be maximized. Moreover, compared with a case that each disconnection portion 151 has other shape (e.g., the first sub-edge 10a, the second sub-edge 10b, the third sub-edge 10c and the fourth sub-edge 10d each have a shape similar to the shape of the second sub-edge 10b, i.e., the edge of the orthographic projection of the third conductive pattern layer 151c in each disconnection portion 151 is cross-shaped), the manufacturing difficulty of each disconnection portion 151 is able to be reduced, and the manufacturing difficulty of the mask used for manufacturing the auxiliary cathode pattern 15 is able to be reduced.

In some embodiments, as shown in FIG. 9, insulating layer(s) are disposed between the auxiliary cathode pattern 15 and the coupling portion 14 (for example, the insulating layer(s) may include the passivation layer 107 and the planarization layer 108). A first via O1 is provided in the insulating layer(s), and the first disconnection portion 151A is coupled to the coupling portion 14 through the first via O1.

In these embodiments, the first disconnection portion 151A is coupled to the coupling portion 14 through the first via O1, so that the first conductive thin film 110 may lapped on the first conductive pattern layer 151a in the first disconnection portion 151A. Based on a fact that the first conductive thin film 110 is further lapped on the first conductive pattern layer 151a in the second disconnection portion 151B, it can be known that the second disconnection portion 151B is also coupled to the coupling portion 14.

Figure 10:
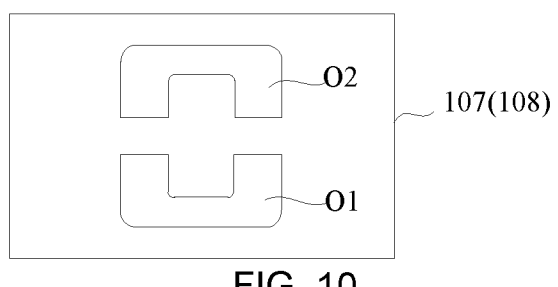
FIG. 10 is a top view of a first via and a second via, in accordance with some embodiments.

In some embodiments, as show in FIGS. 9 and 10, an orthographic projection of an edge of the first via O1 on the substrate 11 is located within an orthographic projection of an edge of the second conductive pattern layer 151b in the first disconnection portion 151A on the substrate 11. Moreover, the orthographic projection of the edge of the first via O1 on the substrate 11 and the orthographic projection of the edge of the second conductive pattern layer 151b in the first disconnection portion 151A on the substrate 11 have a third gap g3 therebetween. The third gap g3 is less than or equal to 5 μm.

In these embodiments, the orthographic projection of the edge of the first via O1 on the substrate 11 is located within the orthographic projection of the edge of the second conductive pattern layer 151b in the first disconnection portion 151A on the substrate 11, and the orthographic projection of the edge of the first via O1 on the substrate 11 and the orthographic projection of the edge of the second conductive pattern layer 151b in the first disconnection portion 151A on the substrate 11 have the third gap g3 therebetween. This means that the orthographic projection of the edge of the second conductive pattern layer 151b in the first disconnection portion 151A on the substrate 11 exceeds the orthographic projection of the edge of the first via O1 on the substrate 11. The third gap g3 is less than or equal to 5 μm, so that a large size of the first via O1 may be ensured, thereby increasing a contact area of the first disconnection portion 151A and the coupling portion 14 to further reduce the resistance of the cathode.

In some embodiments, in combination with FIGS. 8, 9 and 10, the orthographic projection of the edge of the first via O1 on the substrate 11 is substantially parallel to an orthographic projection of an edge of the third conductive pattern layer 151c in the first disconnection portion 151A on the substrate 11.

In some embodiments, as shown in FIGS. 9 and 10, a second via O2 is provided in the insulating layer(s). The second disconnection portion 151B is coupled to the coupling portion 14 through the second via O2.

In these embodiments, by providing the second via O2, and by coupling the second disconnection portion 151B and the coupling portion 14 through the second via O2, a contact area of the auxiliary cathode pattern 15 and the coupling portion 14 is able to be further increased to further reduce the resistance of the cathode.

In some embodiments, as show in FIGS. 9 and 10, an orthographic projection of an edge of the second via O2 on the substrate 11 is located within an orthographic projection of an edge of the second conductive pattern layer 151b in the second disconnection portion 151B on the substrate 11. Moreover, the orthographic projection of the edge of the second via O2 on the substrate 11 and the orthographic projection of the edge of the second conductive pattern layer 151b in the second disconnection portion 151B on the substrate have a fourth gap g4 therebetween. The fourth gap g4 is less than or equal to 5 μm.

In these embodiments, the orthographic projection of the edge of the second via O2 on the substrate 11 is located within the orthographic projection of the edge of the second conductive pattern layer 151b in the second disconnection portion 151B on the substrate 11, and the orthographic projection of the edge of the second via O2 on the substrate 11 and the orthographic projection of the edge of the second conductive pattern layer 151b in the second disconnection portion 151B on the substrate 11 have the fourth gap g4 therebetween. This means that the orthographic projection of the edge of the second conductive pattern layer 151b in the second disconnection portion 151B on the substrate 11 is exceeds the orthographic projection of the edge of the second via O2 on the substrate 11. The fourth gap g4 is less than or equal to 5 μm, so that a large size of the second via O2 may be ensured, thereby increasing a contact area of the second disconnection portion 151B and the coupling portion 14 to further reduce the resistance of the cathode.

In some embodiments, in combination with FIGS. 8, 9 and 10, the orthographic projection of the edge of the second via O2 on the substrate 11 is substantially parallel to an orthographic projection of an edge of the third conductive pattern layer 151c in the second disconnection portion 151B on the substrate 11.

In some embodiments, as shown in FIG. 8, a reference plane CC'DD' perpendicular to the first direction is made on the substrate 11 and between the first disconnection portion 151A and the second disconnection portion 151B. The first disconnection portion 151A and the second disconnection portion 151B are mirror symmetrical with respect to the reference plane CC'DD'.

The first disconnection portion 151A and the second disconnection portion 151B are mirror symmetrical with respect to the reference plane CC'DD', which means that the first disconnection portion 151A and the second disconnection portion 151B are mirror images of each other.

In these embodiments, as shown in FIGS. 8 and 9, the magnitude of the first gap g1 and the shape of the auxiliary cathode pattern 15 are reasonably set, so that in the limited auxiliary cathode region C, the lapping area of the auxiliary cathode pattern 15 and the first conductive thin film 110 is able to be maximized, and the contact area of the auxiliary cathode pattern 15 and the coupling portion 14 is able to be increased. Thus, the resistance of the cathode may be minimized, thereby improving the luminous efficiency.

Some embodiments of the present disclosure provide a manufacturing method of a light-emitting substrate. The light-emitting substrate 1 has a plurality of light-emitting regions A and a non-light-emitting region B. The non-light-emitting region B includes at least one auxiliary cathode region C. The manufacturing method includes a following step.

At least one coupling portion 14 and at least one auxiliary cathode pattern 15 are formed on a substrate 11, and each auxiliary cathode region C is provided with a coupling portion 14 and an auxiliary cathode pattern 15 therein. The coupling portion 14 is located on a side of the auxiliary cathode pattern 15 proximate to the substrate 11, and the auxiliary cathode pattern 15 is coupled to the coupling portion 14.

According to the above, the light-emitting substrate 1 may further include the plurality of pixel driving circuits 100, the pixel driving circuit includes the thin film transistors TFT, and the coupling portion 14 may be made of the same material as the source 105 and the drain 106 of the thin film transistor TFT. It can be known that a step of forming the coupling portion(s) 14 each located in an auxiliary cathode region C on the substrate 11 and a step of forming sources 105 and drains 106 of thin film transistors TFT located in the light-emitting regions A on the substrate 11 may be performed in one patterning process.

Before the coupling portion(s) 14 each located in an auxiliary cathode region C are formed on the substrate 11, the manufacturing method may further include following steps.

Figure 11:
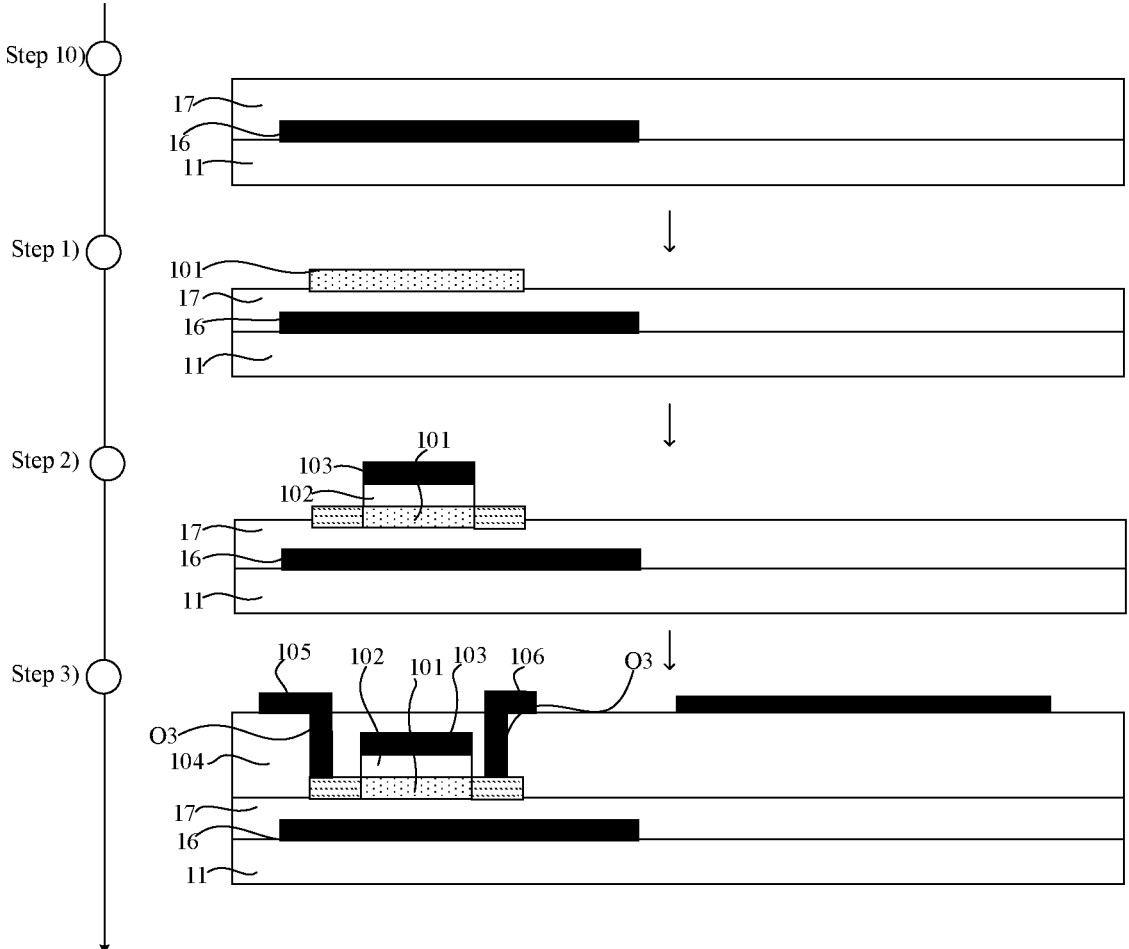
FIG. 11 is a flow diagram of forming thin film transistors, light-shielding layers and buffer layers on a substrate, in accordance with some embodiments.

Active layers 101 of the thin film transistors TFT located in the light-emitting regions A are formed on the substrate 11. Gate insulating layers 102 of the thin film transistors TFT located in the light-emitting regions A are formed on the substrate 11. Gates 103 of the thin film transistors TFT located in the light-emitting regions A are formed on the substrate 11. Interlayer insulating layers 104 of the thin film transistors TFT located in the light-emitting regions A are formed on the substrate 11. As shown in FIG. 11, specific steps may be as follows.

In Step 1), a semiconductor thin film (IGZO), having a thickness in a range of 300 nm to 500 nm, is formed on the substrate 11 by deposition, and the active layers 101 are formed by a patterning process.

In Step 2), an insulating thin film is deposited on the substrate on which the active layers 101 are formed. For example, the insulating thin film may be made of silicon oxide, and may have a thickness in a range of 1000 nm to 2000 nm. The gate insulating layers 102 are formed by a patterning process. A metal thin film is deposited on the substrate on which the gate insulating layers 102 are formed. The metal thin film may be made of copper or a copper-molybdenum alloy. The gates 103 are formed by a patterning process. Then, under a cover of the gate 103, a portion of the active layer 101 uncovered by the gate 103 is made conductive by dry etching.

In Step 3), the interlayer insulating layers 104 are formed on the substrate 11, and third vias O3 are formed in the interlayer insulating layers 104 by a patterning process. Then, when the sources 105 and the drains 106 are formed, the source 105 and the drain 106 are lapped on the conductive portion of the active layer 101 through respective third vias.

Of course, in order to shield the thin film transistors TFT, as shown in FIG. 11, before the thin film transistors TFT are formed, the manufacturing method may further include Step 10). In Step 10), light-shielding layers 16 are formed on the substrate 11. The light-shielding layers 16 may be made of molybdenum or a molybdenum-aluminum alloy, or has a stacked structure of Mo/Al/Mo. The light-shielding layer 16 may have a thickness in a range of 1000 nm to 2000 nm. Moreover, buffer layers 17 are further formed after the light-shielding layers 16 are formed. The buffer layer 17 may be made of SiO, and may have a thickness in a range of 2000 nm to 5000 nm.

In some embodiments, as shown in FIG. 9, each auxiliary cathode pattern 15 includes at least one disconnection portion 151. Each disconnection portion 151 includes a first conductive pattern layer 151*a*, a second conductive pattern layer 151*b*, and a third conductive pattern layer 151*c* stacked in sequence in a direction Y away from the substrate 11. An orthographic projection of an edge of the second conductive pattern layer 151*b* on the substrate 11 is located within an orthographic projection of an edge of the third conductive pattern layer 151*c* on the substrate 11, and is located within an orthographic projection of an edge of the first conductive pattern layer 151*a* on the substrate 11. Moreover, the orthographic projection of the edge of the second conductive pattern layer 151*b* on the substrate 11 and the orthographic projection of the edge of the third conductive pattern layer 151*c* on the substrate 11 have a first gap g1 therebetween.

The orthographic projection of the edge of the second conductive pattern layer 151*b* on the substrate 11 and the orthographic projection of the edge of the first conductive pattern layer 151*a* on the substrate 11 have a second gap g2 therebetween. A total perimeter of the orthographic projection(s) of the edge(s) of the third conductive pattern layer(s) 151*c* in the at least one disconnection portion 151 is greater than a perimeter of an orthographic projection of an edge C1 of the auxiliary cathode region C on the substrate 11.

In these embodiments, a description of the auxiliary cathode pattern 15 may refer to the above description of the auxiliary cathode pattern 15 in the light-emitting substrate 1, and will not be repeated here.

In some embodiments, in a case where the light-emitting substrate 1 further includes first electrodes 131 each located in a light-emitting region A, forming the auxiliary cathode pattern(s) 15 each located in an auxiliary cathode region C on the substrate 11, as shown in FIGS. FIG. 12A to FIG. 12B, and FIG. 13A to FIG. 13B, includes following steps.

Figure 12A:
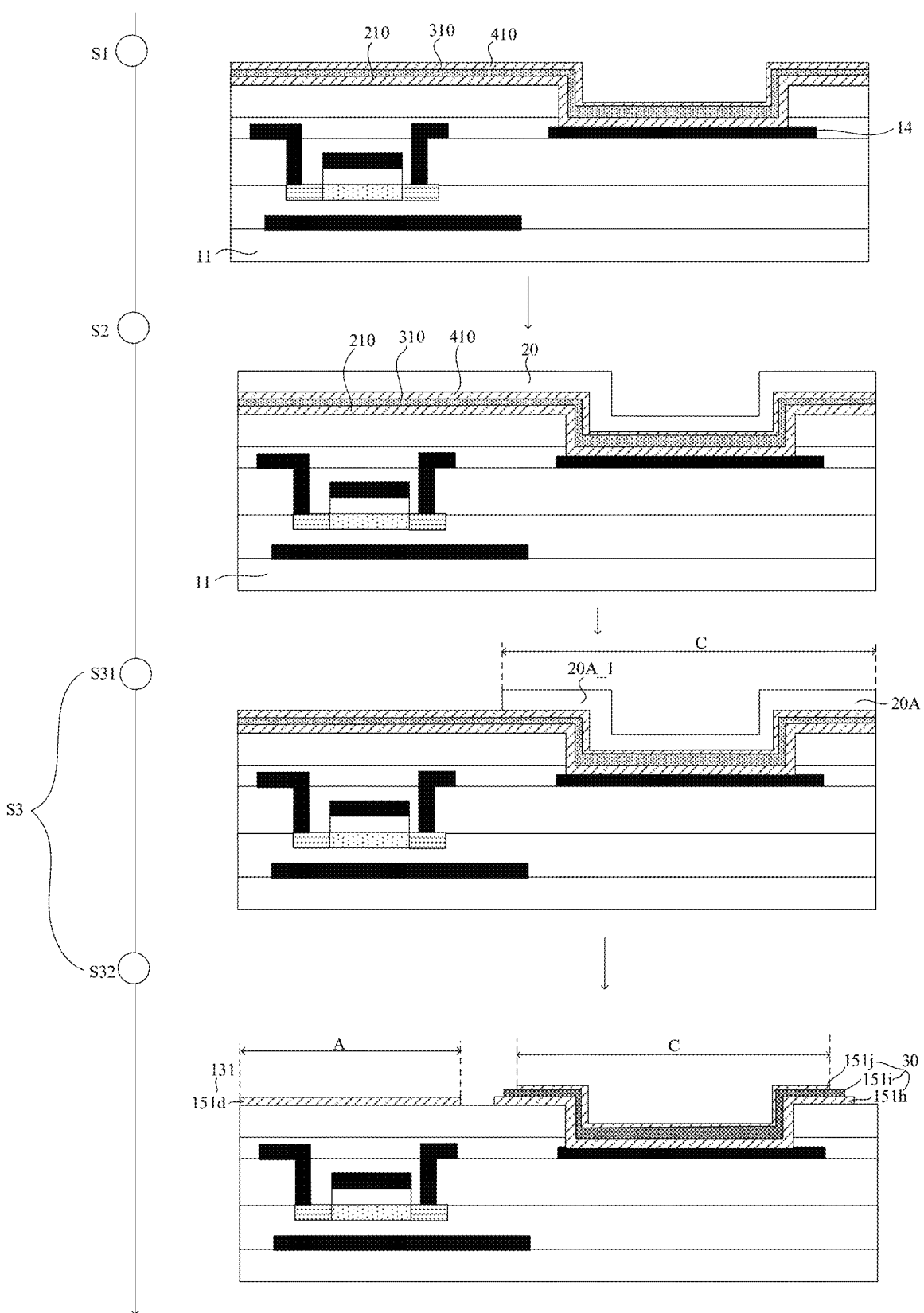
FIG. 12A to FIG. 12B are a flow diagram of forming first electrodes and auxiliary cathode pattern(s) on a substrate, in accordance with some embodiments.
Figure 13A:
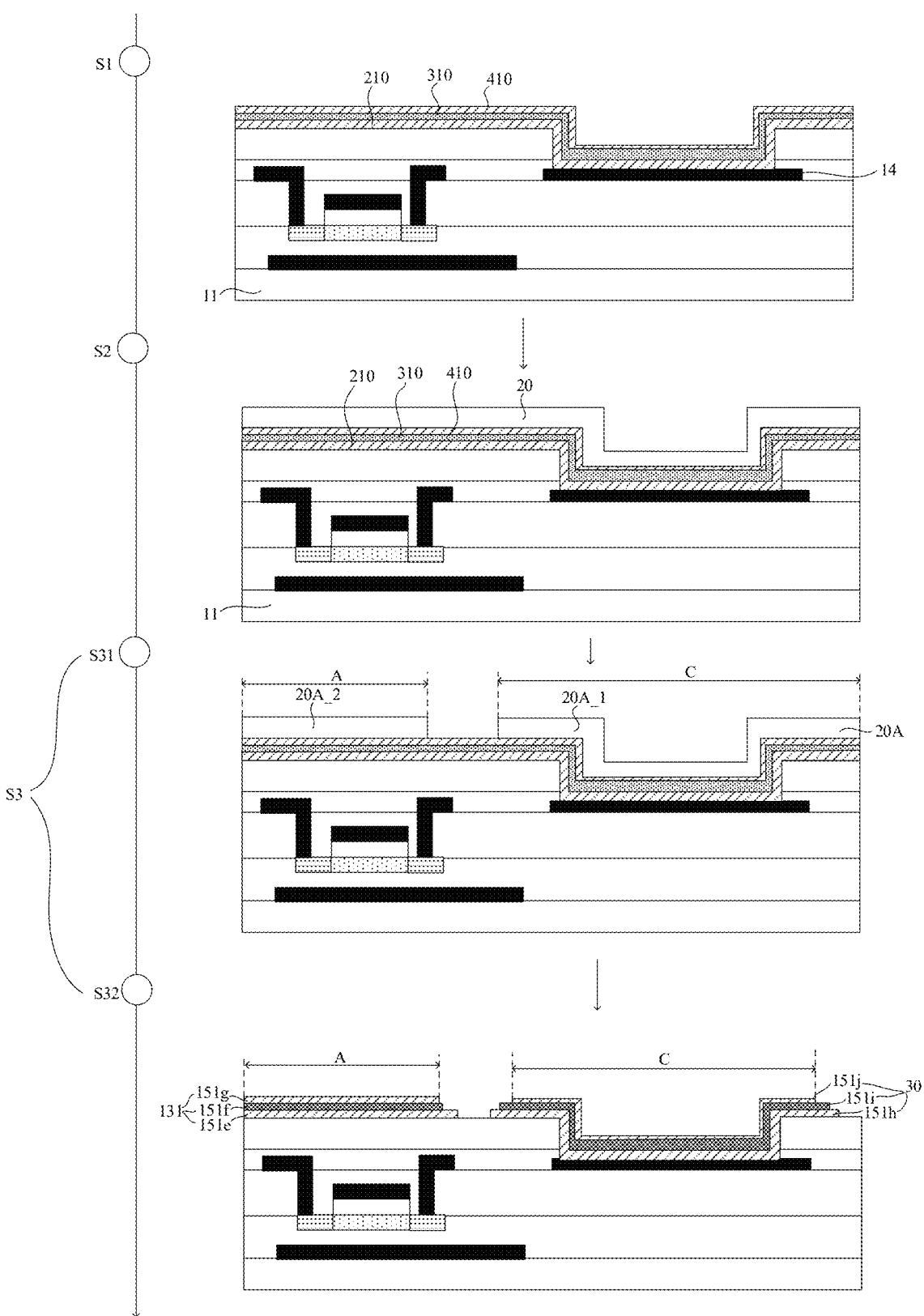
FIG. 13A to FIG. 13B are a flow diagram of forming first electrodes and auxiliary cathode patterns on a substrate, in accordance with some other embodiments.

In S1, as shown in FIGS. 12A and 13A, a second conductive thin film 210, a third conductive thin film 310 and a fourth conductive thin film transistor 410 are formed in sequence on the substrate 11.

In S2, as shown in FIGS. 12A and 13A, a first photoresist layer 20 is formed on the substrate 11 on which the second conductive thin film 210, the third conductive thin film 310 and the fourth conductive thin film 410 are formed.

In S3, as shown in FIG. 12A, the first electrodes 131 each located in a light-emitting region A and at least one electrode pattern 30 each located in an auxiliary cathode region C are formed by exposure, development and etching processes. Each first electrode 131 includes a fourth conductive pattern layer 151*d*. Alternatively, as shown in FIG. 13A, each first electrode 131 includes a fifth conductive pattern layer 151*e*, a sixth conductive pattern layer 151*f* and a seventh conductive pattern layer 151*g* stacked in sequence in the direction Y away from the substrate 11. Each electrode pattern 30 includes an eighth conductive pattern layer 151*h*, a ninth conductive pattern layer 151*i* and a tenth conductive pattern layer 151*j* stacked in sequence in the direction Y away from the substrate 11.

In a case where each first electrode 131 includes the fourth conductive pattern layer 151*d*, forming the first electrodes 131 each located in a light-emitting region A and the at least one electrode pattern 30 each located in an auxiliary cathode region C by the exposure, development and etching processes, as shown in FIG. 12A, includes following steps.

In S31, the first photoresist layer 20 is exposed and developed to obtain a photoresist pattern 20A. The photoresist pattern 20A includes at least one first portion 20A_1 each overlapped with an auxiliary cathode region C.

In S32, under a cover of each first portion 20A_1, the second conductive thin film 210, the third conductive thin film 310 and the fourth conductive thin film 410 are etched to obtain the first electrodes 131 each located in a light-emitting region A and the at least one electrode pattern 30 each located in an auxiliary cathode region C.

In a case where each first electrode 131 includes the fifth conductive pattern layer 151*e*, the sixth conductive pattern layer 151*f* and the seventh conductive pattern layer 151*g*, forming the first electrodes 131 each located in a light-emitting region A and the at least one electrode pattern 30 each located in an auxiliary cathode region C by the exposure, development and etching processes, as shown in FIG. 13A, includes following steps.

In S31, the first photoresist layer 20 is exposed and developed to obtain a photoresist pattern 20A. The photoresist pattern 20A includes at least one first portion 20A_1 each overlapped with an auxiliary cathode region C and second portions 20A_2 each overlapped with a light-emitting region A.

In S32, under covers of each first portion 20A_1 and each second portion 20A_2, the second conductive thin film 210, the third conductive thin film 310 and the fourth conductive thin film 410 are etched to obtain the first electrodes 131 each located in a light-emitting region A and the at least one electrode pattern 30 each located in an auxiliary cathode region C.

Figure 12B:
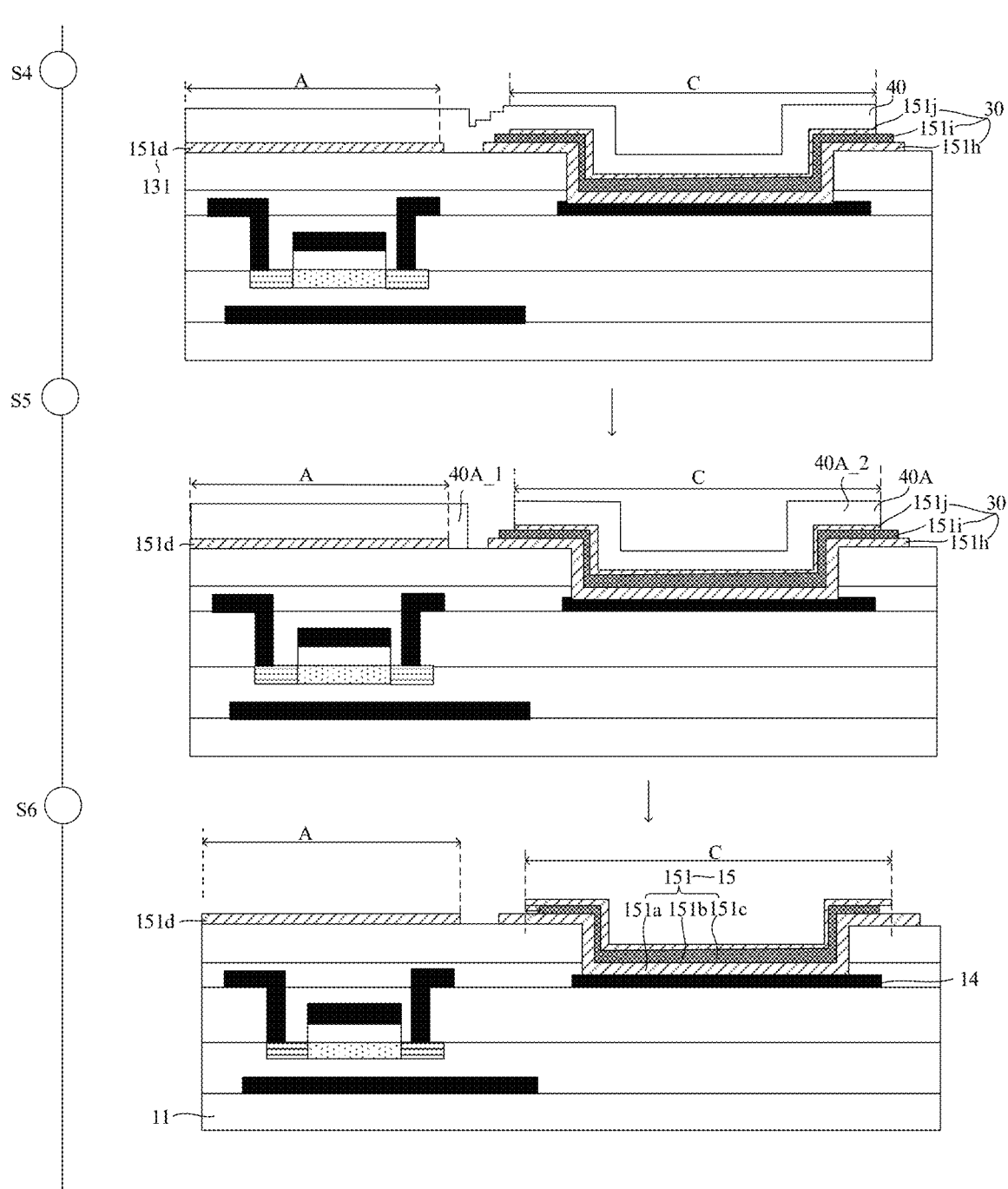
Figure 13B:
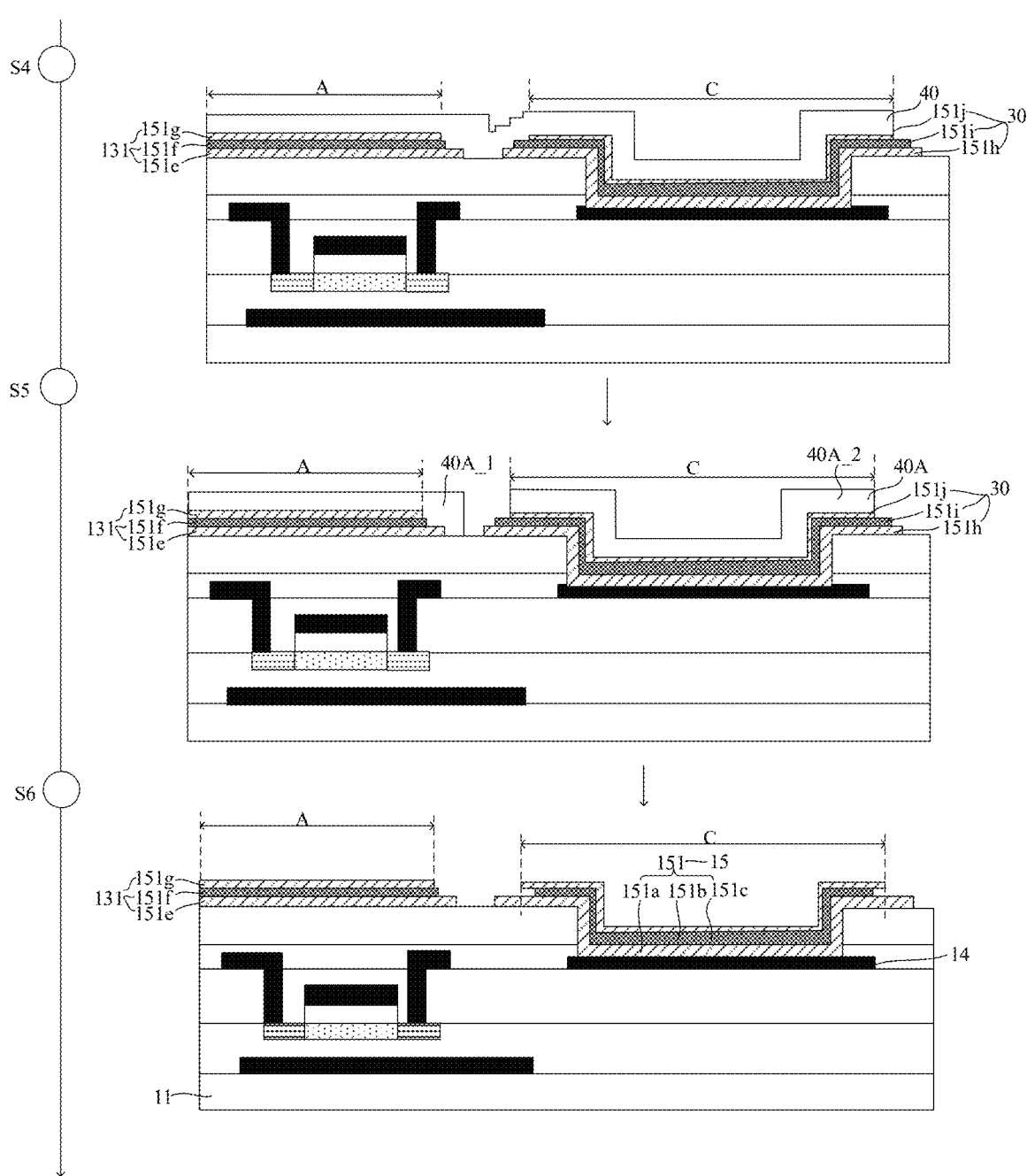

In S4, as shown in FIGS. 12B and 13B, a second photoresist layer 40 is formed on the substrate 11 on which the first electrodes 131 and the at least one electrode pattern 30 are formed.

In S5, as shown in FIGS. 12B and 13B, a photoresist pattern 40A is formed by exposure and development processes. The photoresist pattern 40A includes first portions 40A_1 each covering a first electrode 131 and at least one second portion 40A_2 each covering an electrode pattern 30. An orthographic projection of each conductive pattern layer in each first electrode 131 on the substrate 11 is located within an orthographic projection of a first portion 40A_1 on the substrate 11. An orthographic projection of a second portion 40A_2 on the substrate 11 is located with an ortho-graphic projection of a tenth conductive pattern layer 151j in an electrode pattern 30 on the substrate 11.

The orthographic projection of each conductive pattern layer in each first electrode 131 on the substrate 11 is located within the orthographic projection of the first portion 40A_1 on the substrate 11, which means that an orthographic projection of an edge of each conductive pattern layer in each first electrode 131 on the substrate 11 is located with an orthographic projection of an edge of the first portion 40A_1 on the substrate 11, and the orthographic projection of the edge of each conductive pattern layer in each first electrode 131 on the substrate 11 and the orthographic projection of the edge of the first portion 40A_1 on the substrate 11 have a gap therebetween, or have no gap therebetween. The orthographic projection of the second portion 40A_2 on the substrate 11 is located within the orthographic projection of the tenth conductive pattern layer 151j in the electrode pattern 30 on the substrate 11, which means that an ortho-graphic projection of an edge of the second portion 40A_2 on the substrate 11 is located within an orthographic pro-jection of an edge of the tenth conductive pattern layer 151j in the electrode pattern 30 on the substrate 11, and the orthographic projection of the edge of the second portion 40A_2 on the substrate 11 and the orthographic projection of the edge of the tenth conductive pattern layer 151j in the electrode pattern 30 on the substrate 11 have a gap therebe-tween, or have no gap therebetween.

In S6, as shown in FIGS. 12B and 13B, a portion of the electrode pattern 30 uncovered by the second portion 40A_2 is etched by an etching process, so as to form the auxiliary cathode pattern 15.

The second conductive thin film 210 and the fourth conductive thin film 410 may be made of a same material. During etching, a material of the ninth conductive pattern layer 151i in the electrode pattern 30 is etched by selecting an etching solution with a high selectivity. In the etching process, a rate at which the material of the ninth conductive pattern layer 151i is etched is greater than a rate at which a material of the eighth conductive pattern layer 151h is etched, thereby forming a structure with a shape of "工.".

For example, as shown in FIG. 12A to FIG. 12B, and FIG. 13A to FIG. 13B, the second conductive thin film 210 and the fourth conductive thin film 410 may be made of an ITO material, and the third conductive thin film 310 is made of a metal material.

In this way, when the portion of the electrode pattern 30 uncovered by the second portion 40A_2 is etched, the material of the ninth conductive pattern layer 151i may be etched by selecting an etching solution of the metal material. For example, the metal material may be metal aluminum, and an etching solution of metal aluminum may be a mixed acid containing $HNO_3$, $H_3PO_4$ and AcH (acetic acid). In the etching process, the rate at which the material of the ninth conductive pattern layer 151i is etched is greater than a rate at which a material of the tenth conductive pattern layer 151j is etched, and is greater than the rate at which the material of the eighth conductive pattern layer 151h is etched. By controlling an etching duration, a magnitude of the first gap g1 may be controlled.

In the case where each first electrode 131 includes the fourth conductive pattern layer 151d, based on that the second conductive thin film 210 is made of the ITO material, it can be known that the light-emitting substrate 1 is a bottom-emitting light-emitting substrate. In the case where each first electrode 131 includes the fifth conductive pattern layer 151e, the sixth conductive pattern layer 151f and the seventh conductive pattern layer 151g, based on that the second conductive thin film 210 and the fourth conductive thin film 410 are made of the ITO material, and the third conductive thin film 310 is made of the metal material, it can be known that the light-emitting substrate 1 may be a top-emitting light-emitting substrate.

The foregoing descriptions are only specific implemen-tations of the present disclosure, but the protection scope of the present disclosure is not limited thereto. Changes or replacements that any person skilled in the art could con-ceive of within the technical scope of the present disclosure shall be included in the protection scope of the present disclosure. Therefore, the protection scope of the present disclosure shall be subject to the protection scope of the claims.

What is claimed is:

1. A light-emitting substrate having a plurality of light-emitting regions and a non-light-emitting region except the plurality of light-emitting regions, the non-light-emitting region including at least one auxiliary cathode region; the light-emitting substrate comprising:

a substrate; and at least one coupling portion and at least one auxiliary cathode pattern disposed on the substrate; wherein each auxiliary cathode region is provided with a coupling portion in the at least one coupling portion and an auxiliary cathode pattern in the at least one auxiliary cathode pattern therein; the coupling portion is located on a side of the auxiliary cathode pattern proximate to the substrate, and the auxiliary cathode pattern is coupled to the coupling portion; wherein the auxiliary cathode pattern includes at least one discon-nection portion, and each disconnection portion includes a first conductive pattern layer, a second conductive pattern layer and a third conductive pattern layer stacked in sequence in a direction away from the substrate; an orthographic projection of an edge of the second conductive pattern layer on the substrate is located within an orthographic projection of an edge of the third conductive pattern layer on the substrate, and is located within an orthographic projection of an edge of the first conductive pattern layer on the substrate; and the orthographic projection of the edge of the second conductive pattern layer on the substrate and the orthographic projection of the edge of the third conductive pattern layer on the substrate have a first gap therebetween, and the orthographic projection of the edge of the second conductive pattern layer on the substrate and the orthographic projection of the edge of the first conductive pattern layer on the substrate have a second gap therebetween;

a total perimeter of at least one orthographic projection, on the substrate, of at least one edge of one or more third conductive pattern layers in the at least one disconnection portion is greater than a perimeter of an orthographic projection of an edge of the auxiliary cathode region on the substrate; and the at least one disconnection portion includes a first disconnection portion and a second disconnection portion arranged in sequence in a first direction; an edge of a third conductive pattern layer in the first disconnection portion and an edge of a third conductive pattern layer in the second disconnection portion each include a first sub-edge and a second sub-edge arranged in sequence in the first direction, and a third sub-edge and a fourth sub-edge that are connected between the first sub-edge and the second sub-edge; wherein the two first sub-edges are respectively overlapped with two sub-edges of the edge of the auxiliary cathode region arranged in the first direction, and the two second sub-edges are located between the two first sub-edges; and the first direction is an extending direction of a sub-edge of the edge of the auxiliary cathode region except the two sub-edges respectively overlapped with the two first sub-edges.

2. The light-emitting substrate according to claim 1, wherein in the two second sub-edges, at least one second sub-edge includes a plurality of first extending segments extending in a second direction and staggered in the first direction, and a second extending segment connected between every two adjacent first extending segments; wherein the first direction is perpendicular to the second direction.

3. The light-emitting substrate according to claim 2, wherein the second extending segment extends in the first direction.

4. The light-emitting substrate according to claim 2, wherein the plurality of first extending segments include three first extending segments; in the three first extending segments, in the second direction, a first extending segment in a middle is closer to a corresponding first sub-edge than two first extending segments respectively located on two sides of the first extending segment in the middle; and the two first extending segments respectively located on the two sides are located on a same straight line extending in the second direction.

5. The light-emitting substrate according to claim 1, wherein an insulating layer is disposed between the auxiliary cathode pattern and the coupling portion; and a first via is disposed in the insulating layer, and the first disconnection portion is coupled to the coupling portion through the first via.

6. The light-emitting substrate according to claim 5, wherein an orthographic projection of an edge of the first via on the substrate is located within an orthographic projection of an edge of a second conductive pattern layer in the first disconnection portion on the substrate; the orthographic projection of the edge of the first via on the substrate and the orthographic projection of the edge of the second conductive pattern layer in the first disconnection portion on the substrate have a third gap therebetween; and the third gap is less than or equal to 5 μm.

7. The light-emitting substrate according to claim 5, wherein an orthographic projection of an edge of the first via on the substrate is substantially parallel to an orthographic projection of the edge of the third conductive pattern layer in the first disconnection portion on the substrate.

8. The light-emitting substrate according to claim 5, wherein a second via is further disposed in the insulating layer, and the second disconnection portion is coupled to the coupling portion through the second via.

9. The light-emitting substrate according to claim 8, wherein an orthographic projection of an edge of the second via on the substrate is located within an orthographic projection of an edge of a second conductive pattern layer in the second disconnection portion on the substrate; the orthographic projection of the edge of the second via on the substrate and the orthographic projection of the edge of the second conductive pattern layer in the second disconnection portion on the substrate have a fourth gap therebetween; and the fourth gap is less than or equal to 5 μm.

10. The light-emitting substrate according to claim 9, wherein the orthographic projection of the edge of the second via on the substrate is substantially parallel to an orthographic projection of the edge of the third conductive pattern layer in the second disconnection portion on the substrate.

11. The light-emitting substrate according to claim 1, further comprising a first conductive thin film located in the plurality of light-emitting regions and the non-light-emitting region; wherein the first conductive thin film includes a portion located in a region between the edge of the second conductive pattern layer and the edge of the third conductive pattern layer, and the portion of the first conductive thin film located in the region is in contact with the first conductive pattern layer.

12. The light-emitting substrate according to claim 11, further comprising a thin film with a light-emitting function that is located in the plurality of light-emitting regions and the non-light-emitting region; wherein the thin film with the light-emitting function is located on a side of the first conductive thin film proximate to the substrate, and the thin film with the light-emitting function is non-overlapped with the region.

13. The light-emitting substrate according to claim 1, wherein the second gap is greater than or equal to the first gap, and the first gap is greater than or equal to 0.5 μm.

14. The light-emitting substrate according to claim 1, wherein a reference plane perpendicular to the first direction is made on the substrate and between the first disconnection portion and the second disconnection portion, and the first disconnection portion and the second discon-
nection portion are mirror symmetrical with respect to
the reference plane.

15. The light-emitting substrate according to claim 1,
wherein
the first conductive pattern layer and the third conductive
pattern layer are each made of a transparent material,
and the second conductive pattern layer is made of a
metal material.

16. A light-emitting apparatus, comprising the light-emit-
ting substrate according to claim 1.

17. A manufacturing method of a light-emitting substrate,
the light-emitting substrate having a plurality of light-
emitting regions and a non-light-emitting region except the
plurality of light-emitting regions, the non-light-emitting
region including at least one auxiliary cathode region; the
manufacturing method comprising:
forming at least one coupling portion and at least one
auxiliary cathode pattern on a substrate; wherein each
auxiliary cathode region is provided with a coupling
portion in the at least one coupling portion and an
auxiliary cathode pattern in the at least one auxiliary
cathode pattern therein; the coupling portion is located
on a side of the auxiliary cathode pattern proximate to
the substrate, and the auxiliary cathode pattern is
coupled to the coupling portion; wherein
the auxiliary cathode pattern includes at least one discon-
nection portion, and each disconnection portion
includes a first conductive pattern layer, a second
conductive pattern layer and a third conductive pattern
layer stacked in sequence in a direction away from the
substrate; an orthographic projection of an edge of the
second conductive pattern layer on the substrate is
located within an orthographic projection of an edge of
the third conductive pattern layer on the substrate, and
is located within an orthographic projection of an edge
of the first conductive pattern layer on the substrate;
and the orthographic projection of the edge of the
second conductive pattern layer on the substrate and the
orthographic projection of the edge of the third con-
ductive pattern layer on the substrate have a first gap
therebetween, and the orthographic projection of the
edge of the second conductive pattern layer on the
substrate and the orthographic projection of the edge of the first conductive pattern layer on the substrate have
a second gap therebetween;
a total perimeter of at least one orthographic projection,
on the substrate, of at least one edge of one or more
third conductive pattern layers in the at least one
disconnection portion is greater than a perimeter of an
orthographic projection of an edge of the auxiliary
cathode region; and
the at least one disconnection portion includes a first
disconnection portion and a second disconnection por-
tion arranged in sequence in a first direction; an edge of
a third conductive pattern layer in the first disconnec-
tion portion and an edge of a third conductive pattern
layer in the second disconnection portion each include
a first sub-edge and a second sub-edge arranged in
sequence in the first direction, and a third sub-edge and
a fourth sub-edge that are connected between the first
sub-edge and the second sub-edge; wherein
the two first sub-edges are respectively overlapped with
two sub-edges of the edge of the auxiliary cathode
region arranged in the first direction, and the two
second sub-edges are located between the two first
sub-edges; and
the first direction is an extending direction of a sub-edge
of the edge of the auxiliary cathode region except the
two sub-edges respectively overlapped with the two
first sub-edges.

18. The light-emitting substrate according to claim 2,
wherein
an insulating layer is disposed between the auxiliary
cathode pattern and the coupling portion; and a first via
is disposed in the insulating layer, and the first discon-
nection portion is coupled to the coupling portion
through the first via.

19. The light-emitting substrate according to claim 2,
wherein
a reference plane perpendicular to the first direction is
made on the substrate and between the first disconnec-
tion portion and the second disconnection portion, and
the first disconnection portion and the second discon-
nection portion are mirror symmetrical with respect to
the reference plane.

* * * * *